United States Patent [19]

Nishimura et al.

[11] Patent Number: 5,339,201
[45] Date of Patent: Aug. 16, 1994

[54] OPTICAL COMPUTING ELEMENT

[75] Inventors: Tetsuya Nishimura; Motomu Yoshimura; Mitsuo Maeda, all of Amagasaki, Japan

[73] Assignee: Mitsubishi Denki Kabushiki Kaisha, Tokyo, Japan

[21] Appl. No.: 917,666

[22] Filed: Jul. 20, 1992

Related U.S. Application Data

[63] Continuation of Ser. No. 571,761, Aug. 23, 1990, abandoned, which is a continuation-in-part of Ser. No. 312,073, Feb. 16, 1989, abandoned.

[30] Foreign Application Priority Data

Feb. 17, 1988 [JP] Japan .................................. 63-36024

[51] Int. Cl.$^5$ ........................ G02B 5/22; G11C 13/00; G11B 7/00
[52] U.S. Cl. .................................... 359/891; 359/885; 365/106; 365/119; 369/108; 369/121
[58] Field of Search ................................ 359/885–891, 359/36, 66–68, 388, 389, 634; 365/119, 106; 369/108, 121

[56] References Cited

U.S. PATENT DOCUMENTS

| | | | |
|---|---|---|---|
| 3,801,966 | 4/1974 | Tekao | 365/106 |
| 3,896,420 | 7/1975 | Szabo | 365/119 |
| 4,101,976 | 7/1978 | Castro et al. | 365/119 |
| 4,158,890 | 6/1979 | Burland | 365/119 |
| 4,533,211 | 8/1985 | Bjorklund et al. | 350/162.12 |
| 4,642,413 | 2/1987 | Ovshinsky | 359/885 |
| 4,733,369 | 3/1988 | Bogner | 365/119 |
| 4,779,235 | 10/1988 | Kubota | 365/234 |
| 4,819,206 | 4/1989 | Yoshimura | 365/106 |
| 4,855,951 | 8/1989 | Tomioka et al. | 365/119 |
| 4,962,479 | 10/1990 | Imai et al. | 365/106 |
| 4,985,226 | 1/1991 | Satoh et al. | 365/119 |

FOREIGN PATENT DOCUMENTS

| | | | |
|---|---|---|---|
| 129730 | 1/1985 | European Pat. Off. | 365/119 |
| 8700341 | 1/1987 | European Pat. Off. | 365/119 |

OTHER PUBLICATIONS

"Digital Optical Computing", Alexander A. Sawchuk et al, IEEE, vol. 72, No. 7, Jul. 1984, pp. 758-779.
"Oxo Buturi", vol. 54, No. 10, May 1985, pp. 1019-1030.
"The Optical Computer"-Sciencific American, vol. 248, No. 2 Feb. 1983, Abraham et al, pp. 85-93.
"Multiple Photochemical . . . Aspects", Gutierrez et al, IBM J. Res. Develop; vol. 26, No. 2, Mar. 1982, pp. 198-208.
"Photochemical Hole Burning Materials Involving Hydroxyquinones as Guest Undecules in Hydrogen Bonded Makox Materials", Bargon et al, IBM Technical Disclosure Bulletin, vol. 21, No. 9, Feb. 1979, p. 3764.
Wild et al, "Hole Burnings, Star-Effect and Holographic Image Storage", Proc. Int. Symp. on Optical Memory, 1987, Japanese Journal of Applied Physics, vol. 26, (1987), Supplement 26-4.

*Primary Examiner*—Loha Ben
*Assistant Examiner*—Thong Nguyen
*Attorney, Agent, or Firm*—Wolf, Greenfield & Sacks

[57] ABSTRACT

The invention relates to an optical computing element for use in an optical computer utilizing computing light rays having a plurality of wavelength components. The optical computing element comprises a photo-chemical hole burning element which functions as a wavelength selecting filter of the computing light rays. Therefore, the optical computer using the photo-chemical hole burning element of the invention can perform arithmetic operations by taking advantage of differences in optical wavelength. The computer can efficiently perform bulky arithmetic processing, and can also speedily perform arithmetic operations through simultaneous parallel processing for information.

7 Claims, 13 Drawing Sheets

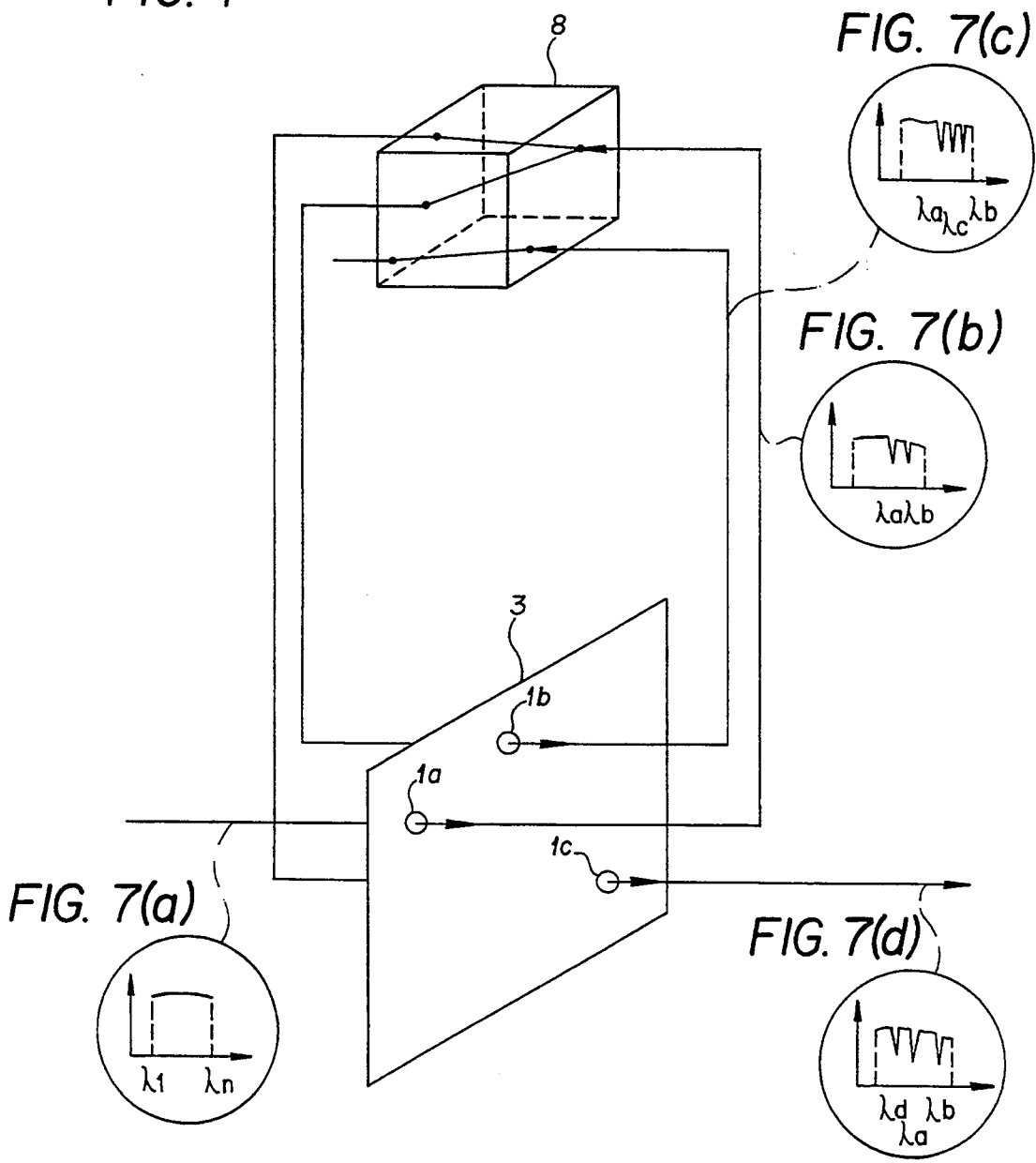

OPTICAL COMPUTING ELEMENT

This application is a continuation of application Ser. No. 07/571,761 filed on Aug. 23, 1990 which in turn is a continuation-in-part of Ser. No. 07/312,073 filed Feb. 16, 1989, both now abandoned.

BACKGROUND OF THE INVENTION

1. Field of the Invention

This invention relates to an optical computing element for use in an optical computer which performs optical parallel operation of the multiplex wavelength type.

2. Description of the Prior Art

FIG. 1 is a fundamental schematic diagram illustrating a conventional optical parallel computer as shown, for example, in Oyo Buturi, vol. 54, No. 10 (1985), pp. 1019–1030. The FIG. 1 optical computer is a computer of the so-called non von Neumann type in which a central processing unit 16 (hereinafter referred to as CPU) and a memory 17 are interconnected in parallel by a plurality of signal lines through an optical interconnection 8 capable of changing a coupling-area. Input of information to the CPU 16 and output from the CPU 16 are channeled through an input-output part 18.

Since the CPU 16 and the memory 17 are interconnected in parallel as above mentioned, programs, data items, and the like are written into and read from the memory 17 in parallel relation through individual signal lines.

With such conventional computer of the non von Neumann type, as above mentioned, however, the difficulty is that although there are a multiplicity of signal lines arranged in parallel, one signal line can deal with one signal only, which fact makes it impracticable to perform bulky operation in an efficient manner.

In an attempt to overcome this difficulty there has been proposed an optical computer in which light rays having a plurality of wavelengths are used as computing light rays to enable arithmetic operations to be executed in optical wavelength orders. However, there has been no corresponding development of an element which could control only a particular wavelength component of such computing light rays having a plurality of wavelengths.

SUMMARY OF THE INVENTION

This invention is directed to solving the foregoing problems with the prior art, and the optical computing element of the invention for use in an optical computer capable of performing wavelength-multiplexed optical parallel operations is a photo-chemical hole burning element (hereinafter referred to as PHB) useful as a wavelength selecting filter of computing light rays having a plurality of wavelength components. The element in accordance with the invention can be employed in optical computers for various purposes, such as input light wavelength selection, output light wavelength selection, threshold value processing in an operation gate array, optical memory, and optical interconnection.

It is a first object of the invention to provide an optical computing element for use in an optical computer which enables arithmetic processing utilizing differences in optical wavelength.

It is a second object of the invention to provide an optical computing element for use in an optical computer which enables bulky arithmetic processing.

It is a third object of the invention to provide an optical computing element which enables selection of light rays having a necessary wavelength for arithmetic processing which it is used as an element for input light wavelength selection.

It is a fourth object of the invention to provide an optical computing element which enables selection of light rays having a necessary wavelength after arithmetic processing when it is used as an element for output light wavelength selection.

It is a fifth object of the invention to provide an optical computing element which enables performance of gate functions in wavelength orders when it is used as a gate array for a sequential logic system.

It is a sixth object of the invention to provide an optical computing element which enables threshold processing to be performed in wavelength orders when it is used as a nonlinear threshold element.

It is a seventh object of the invention to provide an optical computing element which enables information to be recorded in multiplex wavelengths when the element is used as an optical memory element.

It is an eighth object of the invention to provide an optical computing element which enables different optical interconnections to be formed for individual wavelengths when the element is used as an optical interconnection element.

The above and further objects and features of the invention will more fully be apparent from the following detailed description with accompanying drawings.

BRIEF DESCRIPTION OF THE DRAWINGS

FIG. 7 is a schematic diagram showing an embodiment in which the element of the invention is used as a gate array, FIGS. 7a–7d illustrate a spectrum of a light beam during respective processing stages shown therein;

FIGS. 9a-9c illustrate a spectrum of a light beam having a particular bandwidth emitted from the respective pits;

DESCRIPTION OF THE PREFERRED EMBODIMENTS

Preferred embodiments of the invention will now be described in detail.

Figure 2:
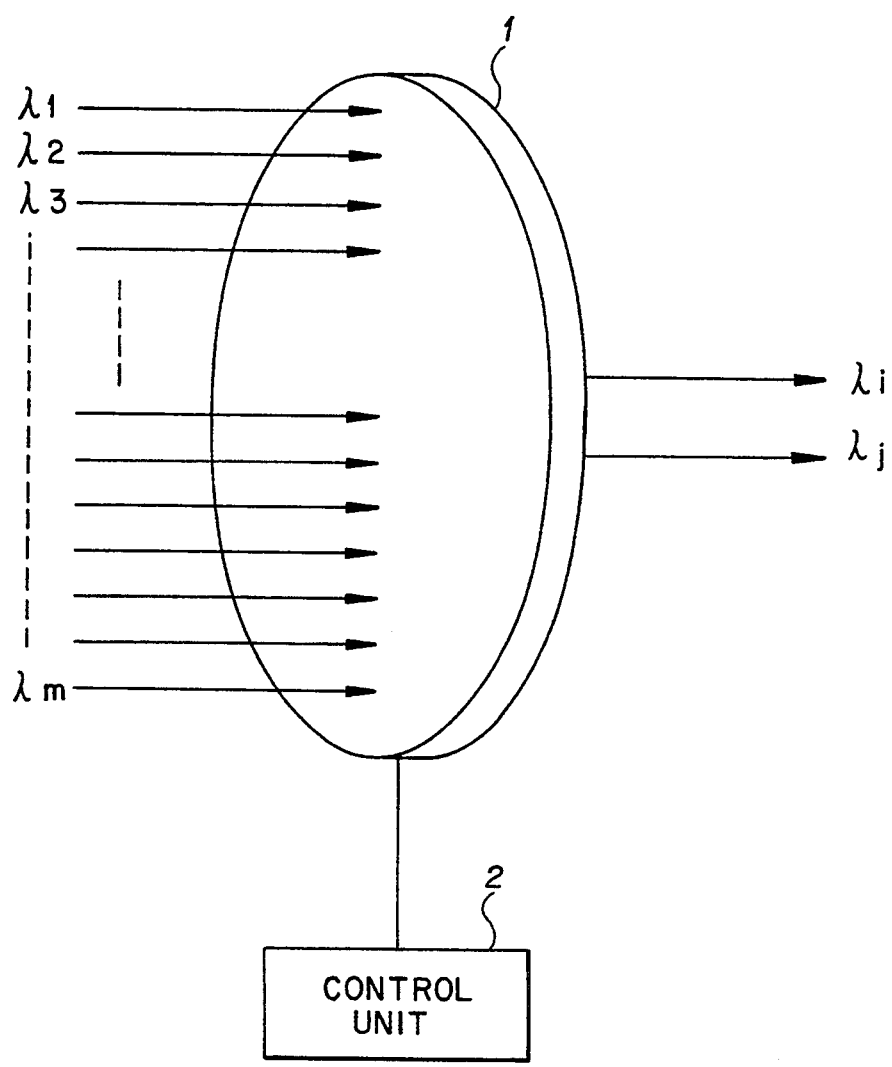
FIG. 2 is a schematic diagram illustrating the concept of wavelength selection with an optical computing element according to the invention.

Firstly, the concept of wavelength selection by means of the computing element in accordance with the invention will be explained. FIG. 2 is a schematic diagram illustrating the concept. In FIG. 2, numeral 1 designates a pit (an area having a certain expanse as one information unit on which a wavelength-multiplexed light beam is incident) within a PHB medium. The pit 1 is electrically or optically controlled by a control unit 2 with respect to its PHB characteristics (wavelength selectivity).

Next, the manner of operation will be explained.

Light rays having multiplexed wavelengths are incident on individual pits 1 in the PHB medium. The incident light in this case consists of m-number of light rays of different wavelengths, $\lambda_1$-$\lambda_m$, including d-number ($d \leq m$) of data light rays and (m-d)-number of computing or control light rays. The PHB characteristics of each individual pit are controlled by the control unit 2 or control light rays so that light rays of particular wavelengths $\lambda_i$, $\lambda_j$ ($1 \leq i, j \leq m$) only are allowed to transmit.

Therefore, the wavelength selectivity of each pit can be controlled as desired, it being thus possible to deal with various pieces of information by taking advantage of the differences in wavelength. In other words, units of information can be dealt with in wavelength orders. This makes it possible to arrange signal lines in parallel so that the signal lines can individually permit wavelength-multiplexing, which means increased capacity of information processing.

Figure 1:
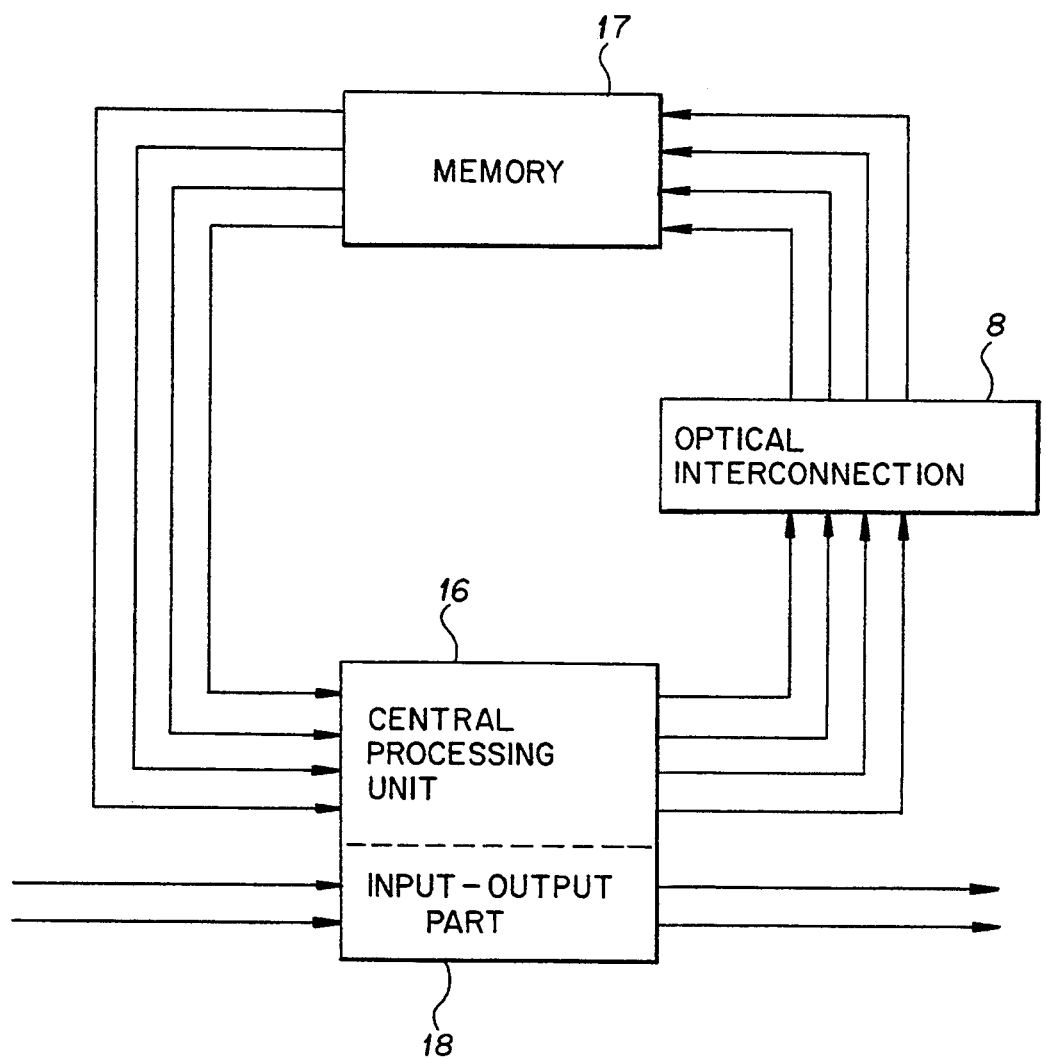
FIG. 1 is a schematic diagram showing a fundamental configuration of an optical-parallel computer.
Figure 3:
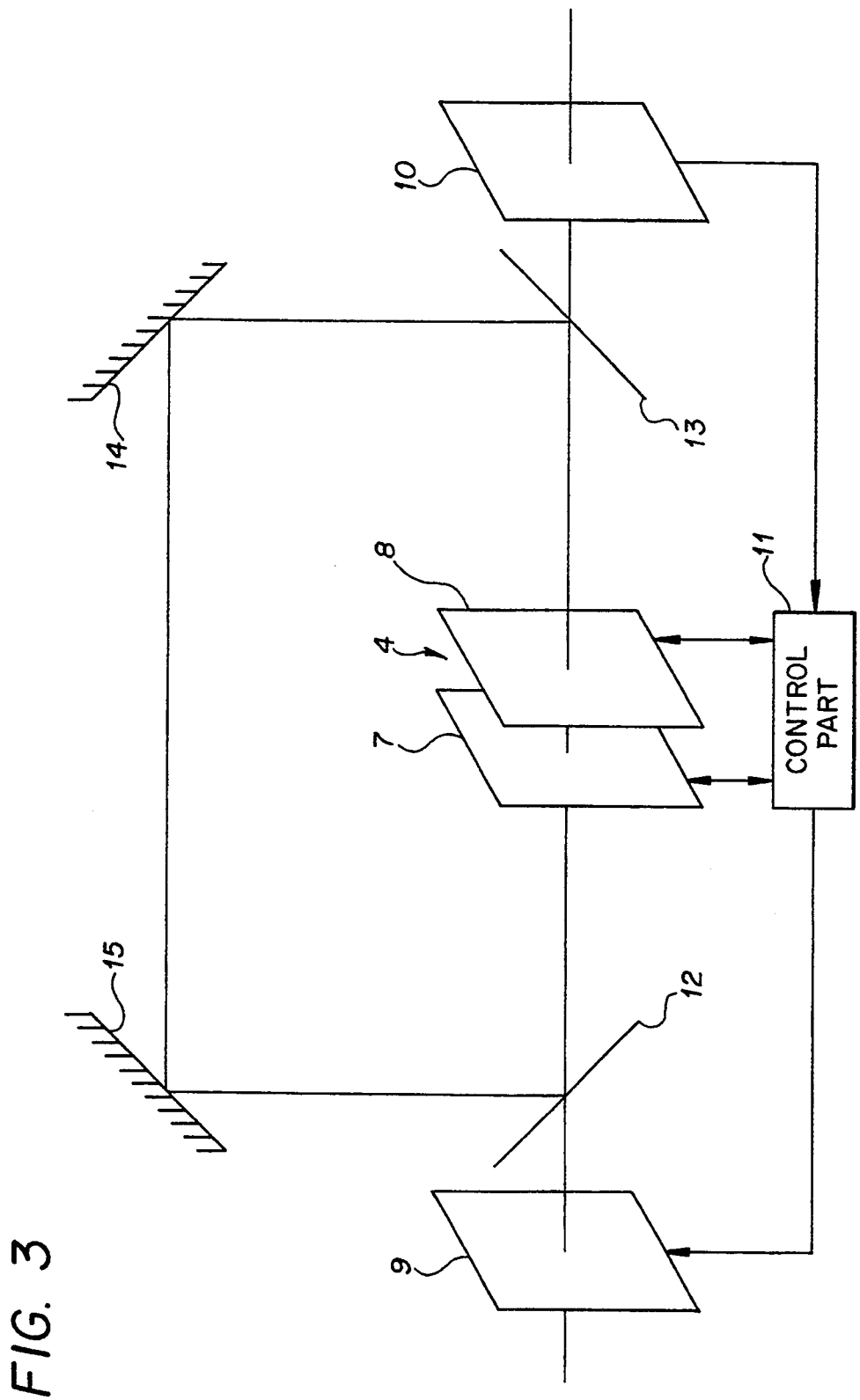
FIG. 3 is a block diagram showing a fundamental arithmetic unit.

FIG. 3 is a schematic diagram showing a fundamental arrangement of an optical apparatus to which the above-described concept is applied. In FIG. 3, numeral 7 designates a hybrid processing unit (hereinafter referred to as HPU) having en bloc all functions of the CPU 16, memory 17, and input/output part 18 shown in FIG. 1, and numeral 8 designates above mentioned coupling-area variable optical interconnection, the HPU 7 and optical interconnection 8 constituting an arithmetic unit 4. On the optical input side of the arithmetic unit 4 there is disposed a light emitting part 9 emitting wavelength-multiplexed light rays, and there is disposed a beam splitter 12 between the light emitting part 9 and the HPU 7. A light receptor part 10 is disposed on the optical output side of the arithmetic unit 4, there being provided a beam splitter 13 between the light receptor part 10 and the optical interconnection 8. There are provided mirrors 15 and 14 optically suitably positioned relative to the beam splitters 12 and 13 respectively in order to cause a light beam from the arithmetic unit 4 to be incident on the arithmetic unit 4 again. The arithmetic unit 4, beam splitter 13, mirrors 14, 15 and beam splitter 12 are arranged to form one optical path. Shown by 11 is a control part which controls these optical members altogether.

The manner of operation will now be explained.

Wavelength-multiplexed light rays emitted from the light emitting part 9 become incident on the arithmetic unit 4 via the beam splitter 12. In the arithmetic unit 4, one or more kinds of processing of various kinds of processing, such as input light wavelength selection, output light wavelength selection, arithmetic gate array threshold processing, and wavelength selection for the optical interconnection, are carried out. After the processing, a part of the light beam emitted from the arithmetic unit 4 is inputted directly to the light receptor part 10, and the rest of the light beam is caused to become incident on the arithmetic unit 4 again through the beam splitter 13, mirror 14, mirror 15, and beam splitter 12, for next processing.

In FIG. 3, only an optical axis is shown with respect to signal lines, but it is to be understood that the light transmission has a spacious expanse and that individual signal lines are so arranged as to permit wavelength multiplexing.

Figure 4A:
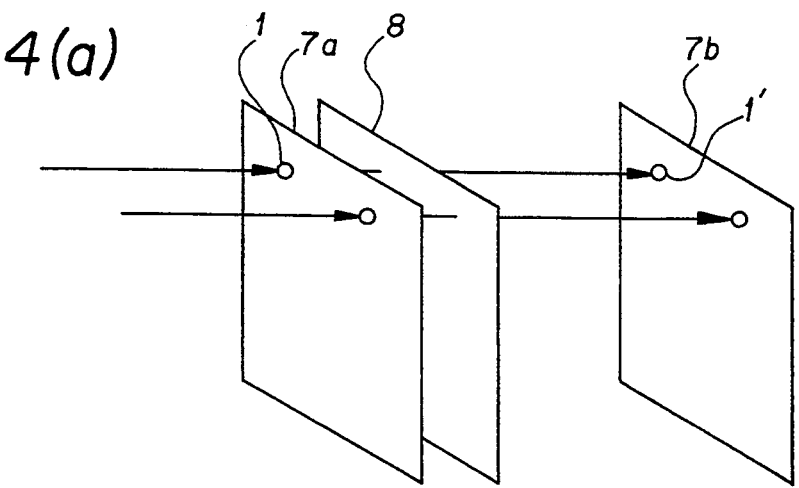
FIGS. 4(a), (b), and (c) are schematic diagram showing, by way of example, forms of optical interconnection between arithmetic units.
Figure 4B:
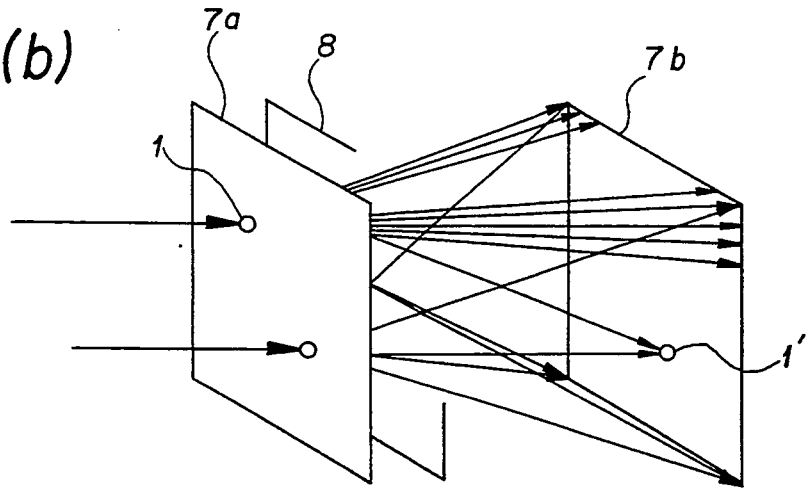
Figure 4C:
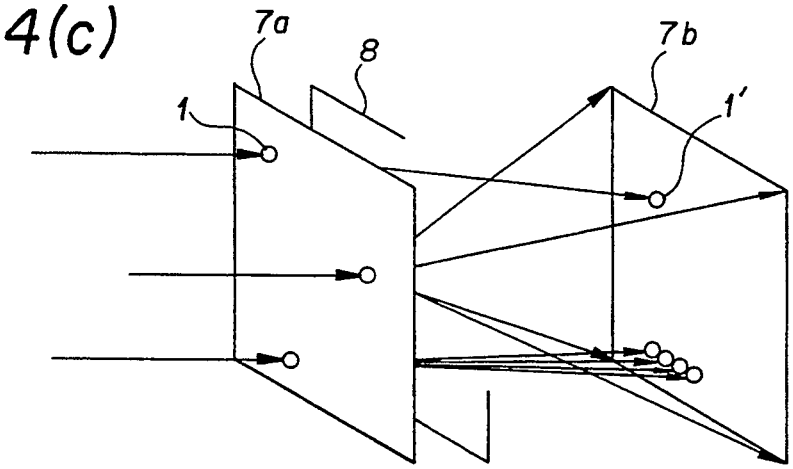

FIG. 4 is a schematic diagram showing, by way of example, forms of optical interconnection. In the drawing, 7a, 7b designates HPU, with an optical connection 8 disposed between the first stage HPU 7a and the second stage HPU 7b. FIG. 4(a) shows an instance in which signals are transmitted from the first stage pits 7a to the second stage pits 7b in one to one relation. In this instance, arithmetic operations can be carried out in simultaneous parallel relation without correlation of the first and second stage pits. In FIG. 4(b), there is shown an instance in which optical information from one first stage pit 1 is transmitted to all second stage pits, in which case holographic processing, such as associative memory, can be carried out. FIG. 4(c) shows a case in which each pit has a variable coupling area. In this instance, flexible data processing can be performed. As above described, according to this embodiment, parallel arithmetic operations in which the coupling areas are variable, in addition, an information from one or more first stage pits in wavelength orders is effectively coupled in one second stage pit or between a plurality of second stage pits, whereby processing operations, such as image processing, numeric value computation, pattern matching, associative memory, and deduction machine, can be efficiently carried out.

Next, embodiments in which the optical computing element of the information (hereinafter referred to as the element of the invention) is employed will be described in detail.

Figure 5:
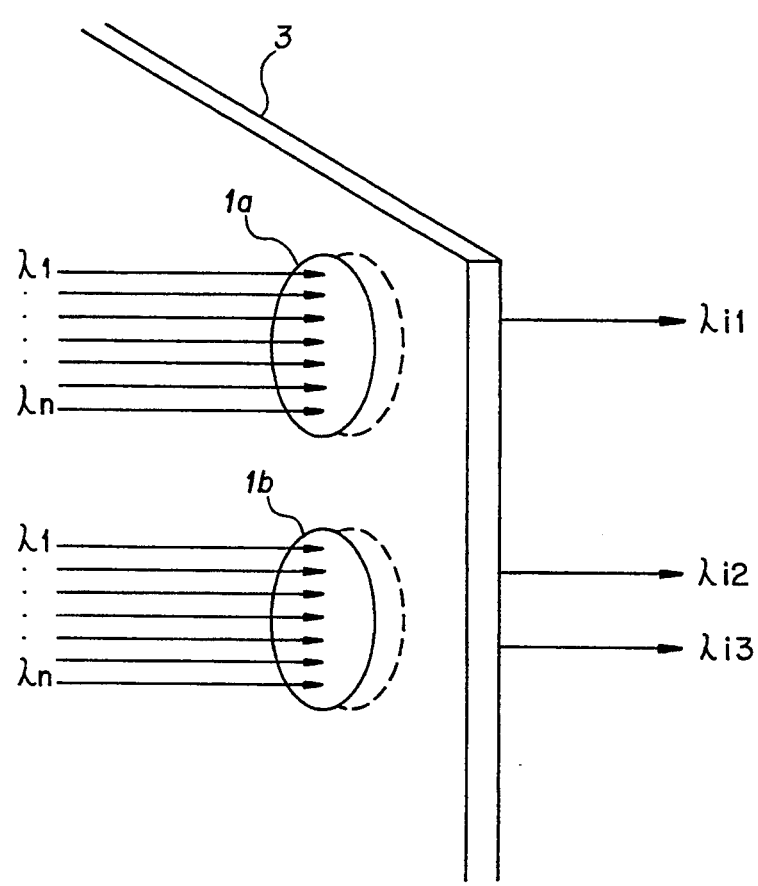
FIG. 5 is a schematic diagram showing an embodiment in which the element of the invention is used as an input element, particularly illustrating a photo-chemical hole burning element having pits for selecting wavelengths.
Figure 5A:
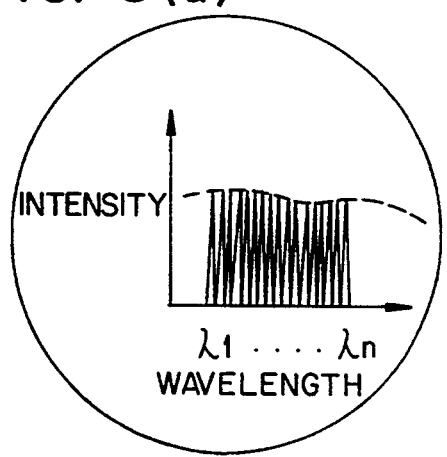
FIG. 5a illustrates a spectrum of a light beam applied to the pits in FIG. 5.

FIG. 5 is a schematic diagram showing an embodiment in which the element of the invention is employed as an input light wavelength selecting element. In the drawing, 3 designates a PHB medium, and 1a, 1b designate pits. In this embodiment, each pit 1a, 1b independently acts as a wavelength filter, which controls input light rays having n-number of wavelengths, with such wavelength spectra as shown in FIG. 5(a). In the pit 1a, only a light ray having a wavelength $\lambda_{i1}$ is allowed to transmit, whereas in the pit 1b, only light rays having wavelengths $\lambda_{i2}$ and $\lambda_{i3}$ are allowed to transmit. In this way, spectral patterns corresponding to information items to be dealt with can be obtained as desired.

Figure 6:
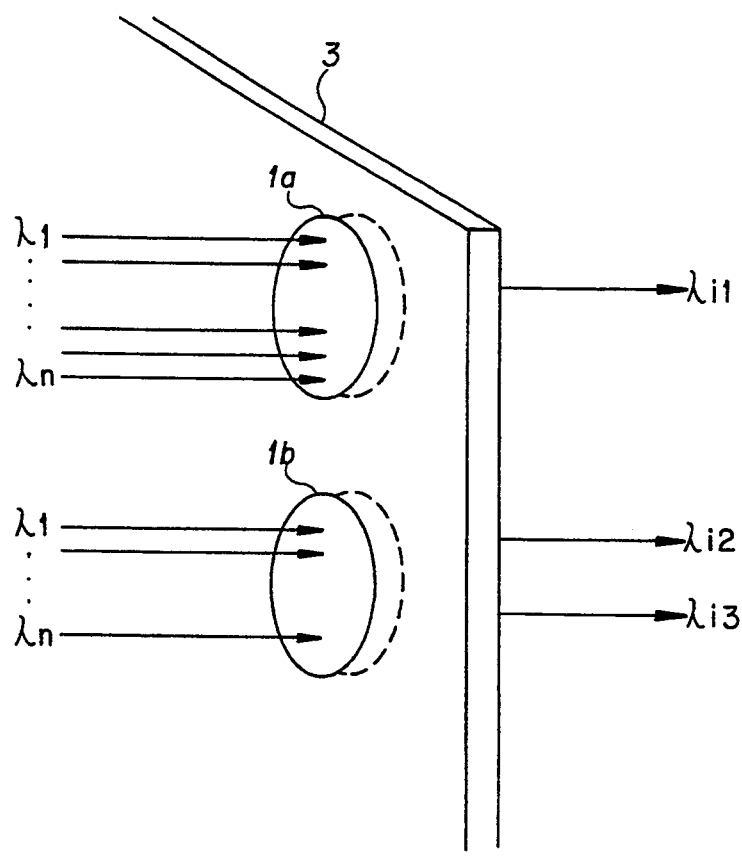
FIG. 6 is a schematic diagram showing an embodiment in which the element of the invention is used as am output element, particularly illustrating a photo-chemical hole burning element having pits for selecting output wavelengths.
Figure 6A:
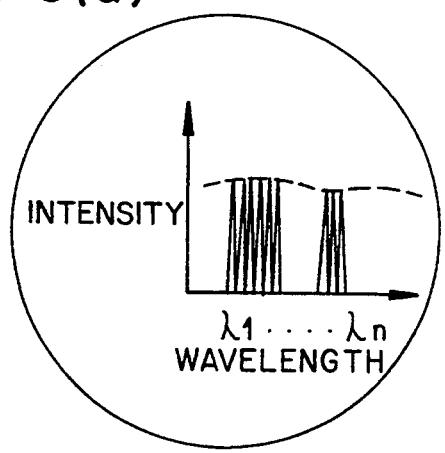
FIG. 6a illustrates a spectrum of a light beam incident on the pits of FIG. 6.

FIG. 6 is a schematic diagram showing an embodiment in which the element of the invention is used as an output light wavelength selecting element, the arrangement of which is same as that of the previous embodiment in which the element is used as an input light wavelength selecting element. Whereas, in the previous case for input light wavelength selection, light rays of such wavelength as is necessary for arithmetic operation in general are selected, in the case of output light wavelength selection, light rays of such wavelength as is necessary as a result of arithmetic operation are selected.

FIG. 7 is a schematic diagram showing an embodiment in which the element of the invention is employed as a gate array for a sequential logic system. In the drawings, 1a, 1b and 1c designate pits, 3 designates a PHB medium, and 8 designates an optical interconnection. In the gate array of this embodiment, signal lines are individually arranged to permit wavelength multiplexing so that in the pits connected in the sequence of a series of arithmetic operations, operations are performed in wavelength orders. More specifically, light rays having such a wavelength spectrum (wavelengths $\lambda_1$–$\lambda_n$) as shown in FIG. 7(a) are processed in the pit 1a, and after they are changed into such a wavelength spectrum (with wavelength $\lambda_a$, $\lambda_b$ components attenuated), the light rays are divided by the optical interconnection 8 between two signal lines, being then caused to become incident again on separate pits 1b, 1c on the PHB medium 3. The light ray incident on the pit 1b is subjected to separate processing in the pit 1b, and after it is changed to such a wavelength spectrum as shown in (c) (with wavelength $\lambda_c$ component further attenuated), the light ray is caused to become incident again on the optical interconnection 8 again. The light incident on the pit 1c is subjected to separate processing in the pit (c), and after it is changed to such spectral pattern of wavelength as shown in (d) (with wavelength $\lambda_d$ component further attenuated), the light ray is emitted externally. As described above, the gate array in the present embodiment, unlike any conventional gate array, can execute its gate function in wavelength orders.

Figure 8:
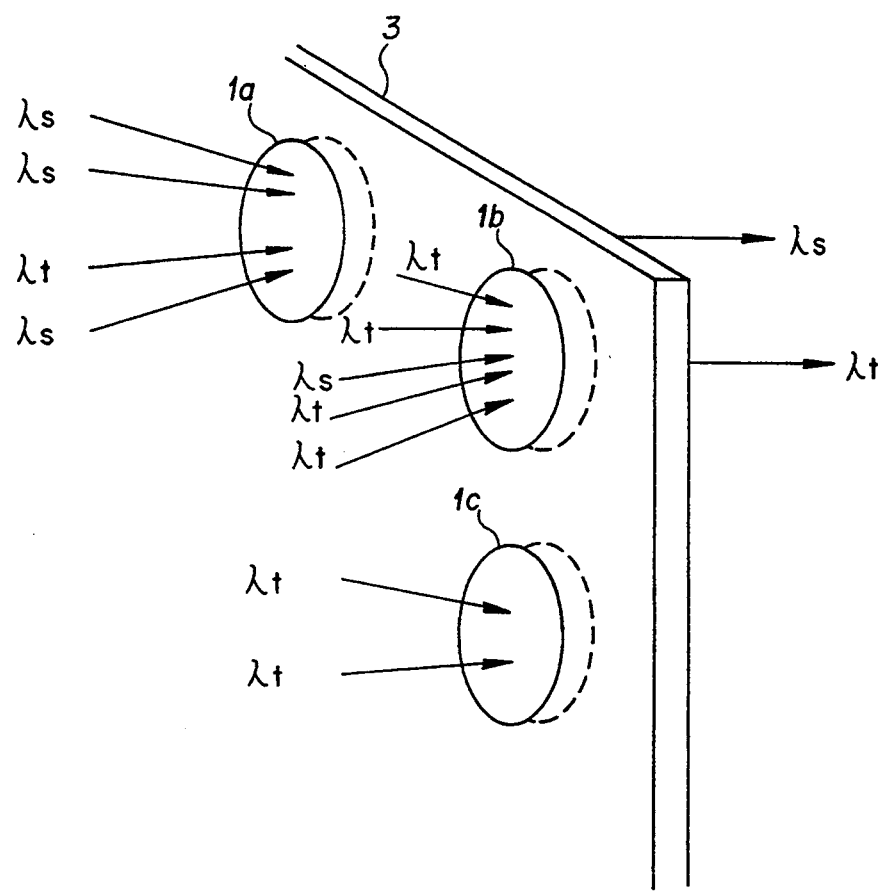
FIG. 8 is a schematic diagram showing an embodiment in which the element of the invention is used as a nonlinear threshold element.
Figure 8A:
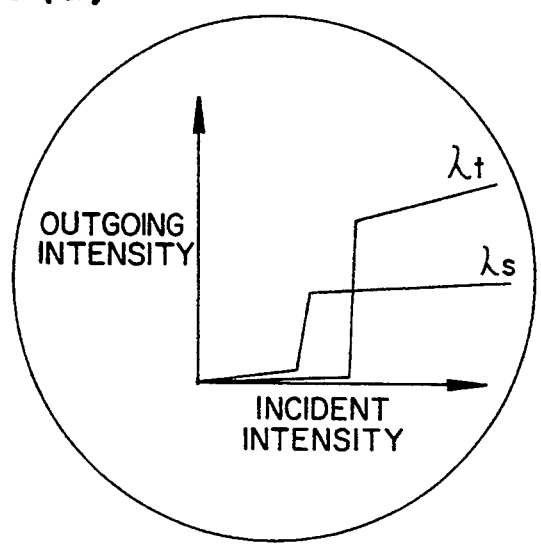
FIG. 8a illustrates the relation between the incident intensity and the outgoing intensity of the light beam having a given wavelength incident on one of the pits of FIG. 8.

FIG. 8 is a schematic diagram showing an embodiment in which the element of the invention is used as a nonlinear threshold element. Multiplexed wavelength information items are entered from a plurality of pits in the first stage CPU into pits 1a, 1b, 1c, in which switching operation as shown in (a) is performed correspondingly to the intensity of incident light of each wavelength. More specifically, in the pit 1a a light ray of wavelength $\lambda_s$ only is allowed to transmit, and in the pit 1b, only a light ray of wavelength $\lambda_t$ is allowed to transmit, no light transmission being effected in the pit 1c. As above described, the PHB medium 3 can function as a wavelength multiplexed nonlinear threshold element.

Figure 9:
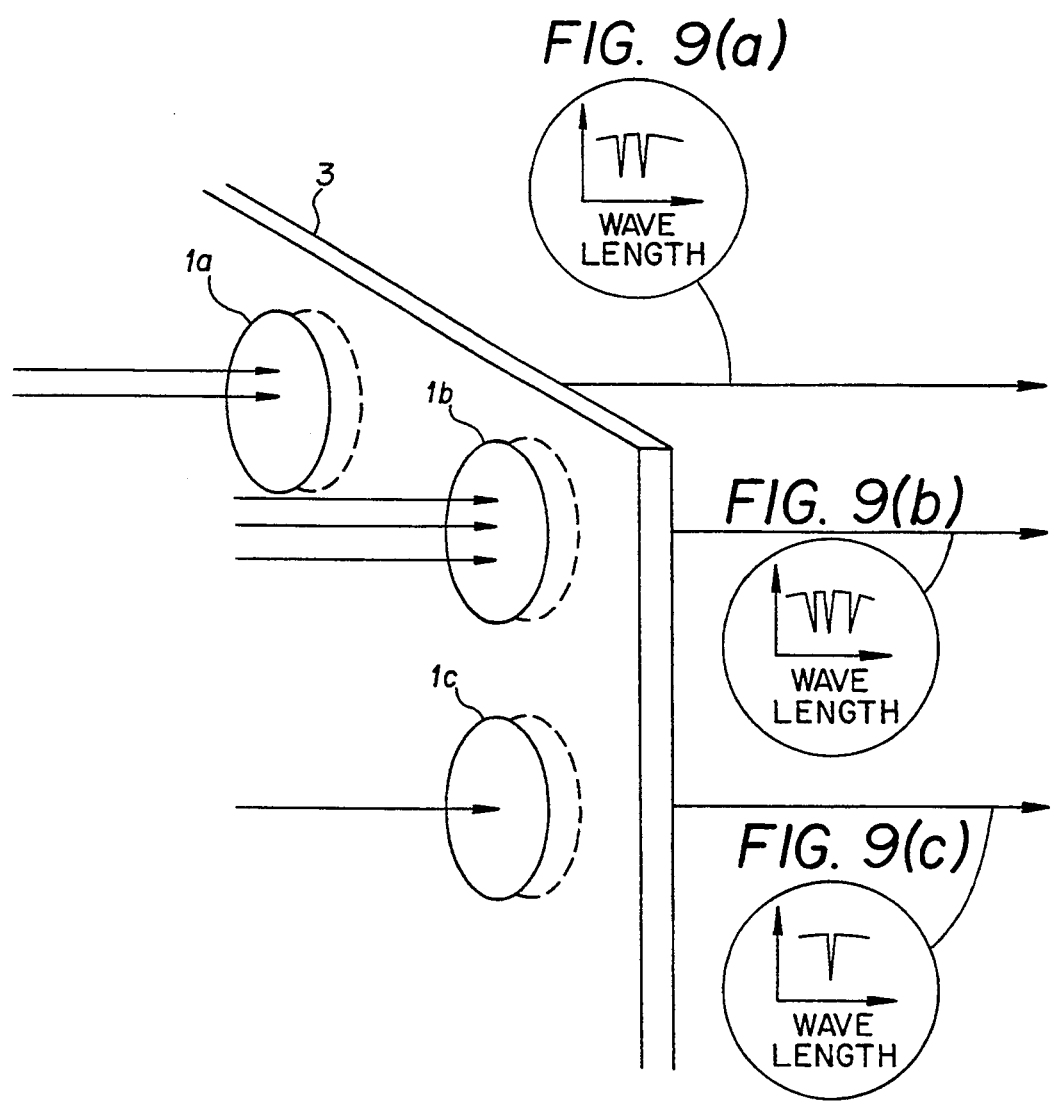
FIG. 9 is a schematic diagram showing an embodiment in which the element of the invention is used a memory/delay element.

FIG. 9 is a schematic diagram showing an embodiment in which the element of the invention is used as an optical memory element, such as internal memory, buffer, and register in an optical computer. Individual elements used in such a way record wavelength-multiplexed optical information items having such spectral patterns of wavelengths as shown in (a), (b), (c) as they are, in individual pits 1a, 1b, 1c respectively. With this embodiment, therefore, information items can be recorded on a wavelength-multiplexed basis.

Figure 10:
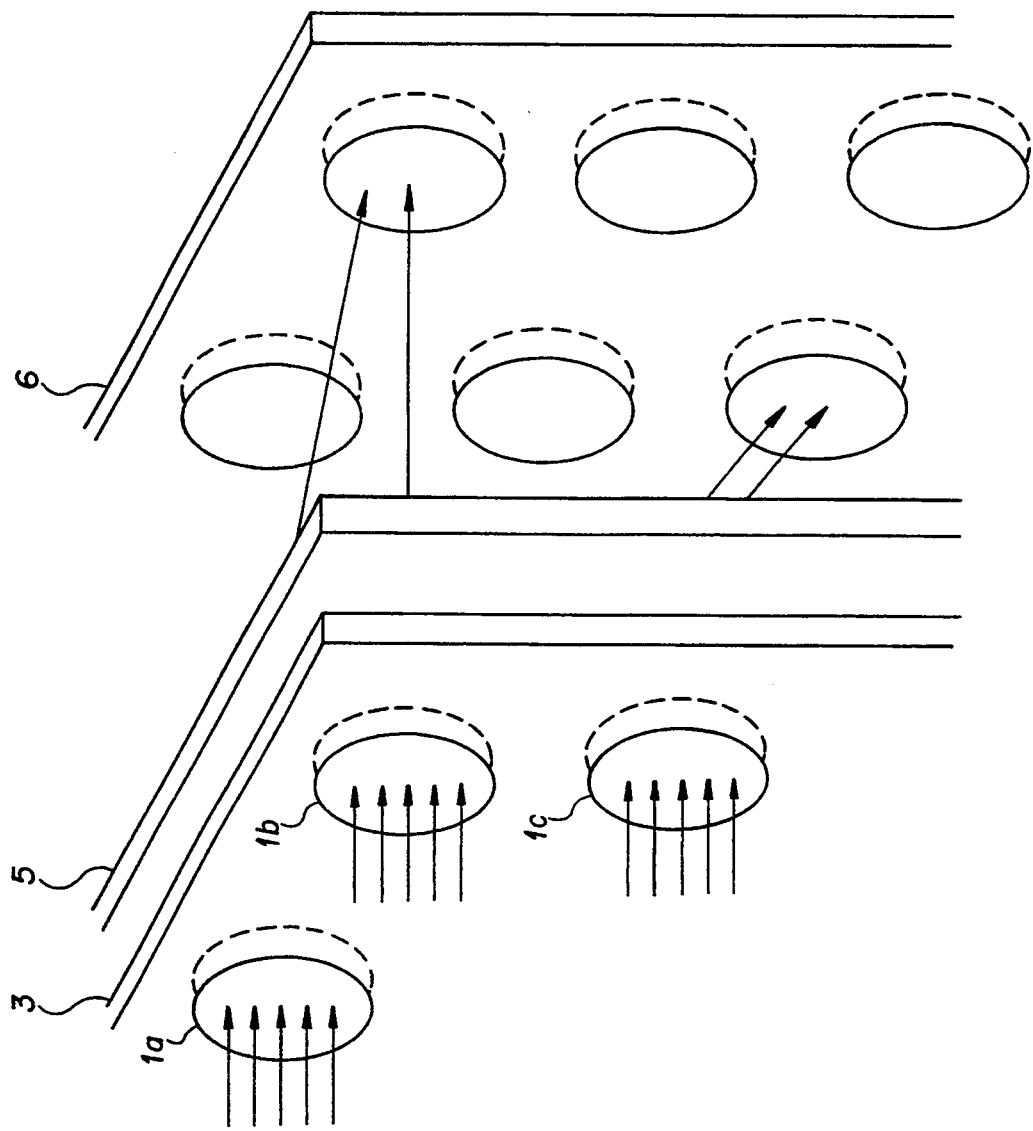
FIG. 10 is a schematic diagram showing an embodiment in which the element of the invention is used as an optical interconnection element.

FIG. 10 is a schematic diagram showing an embodiment in which the element of the invention is used as an optical interconnection element. In the drawing, numeral 5 designates an optical interconnection element and 6 designates a next stage information processing layer for receiving information. The optical interconnection element 5 in this embodiment has a function of controlling the amount of optical transmission with a given wavelength to a particular pit having the information processing layer 6 in the case of the global operation among pits. In this embodiment, therefore, different optical interconnections can be formed with respect to different wavelengths.

In the foregoing embodiments, pits are of a two-dimensional planar arrangement. Needless to say, however, the invention is not limited to such pit arrangement; the optical computing element can be equally applicable in the case where the PHB medium is of a multilayer configuration or of a stereoregular and three-dimensional structure.

According to the invention, as above described, by using a PHB element as an optical computing element, it is possible to achieve wavelength multiplexing for each pit by the PHB medium in the process of optical computing, thereby to increase the processible volume of information to more than 1000 times as much as that possible with the prior art arrangement.

Further, in the process of optical computing, it is possible to eliminate the tediousness of arithmetic operation involved in simultaneous parallel information processing and to provide a new optical computing method which assures high processing efficiency.

Figure 11:
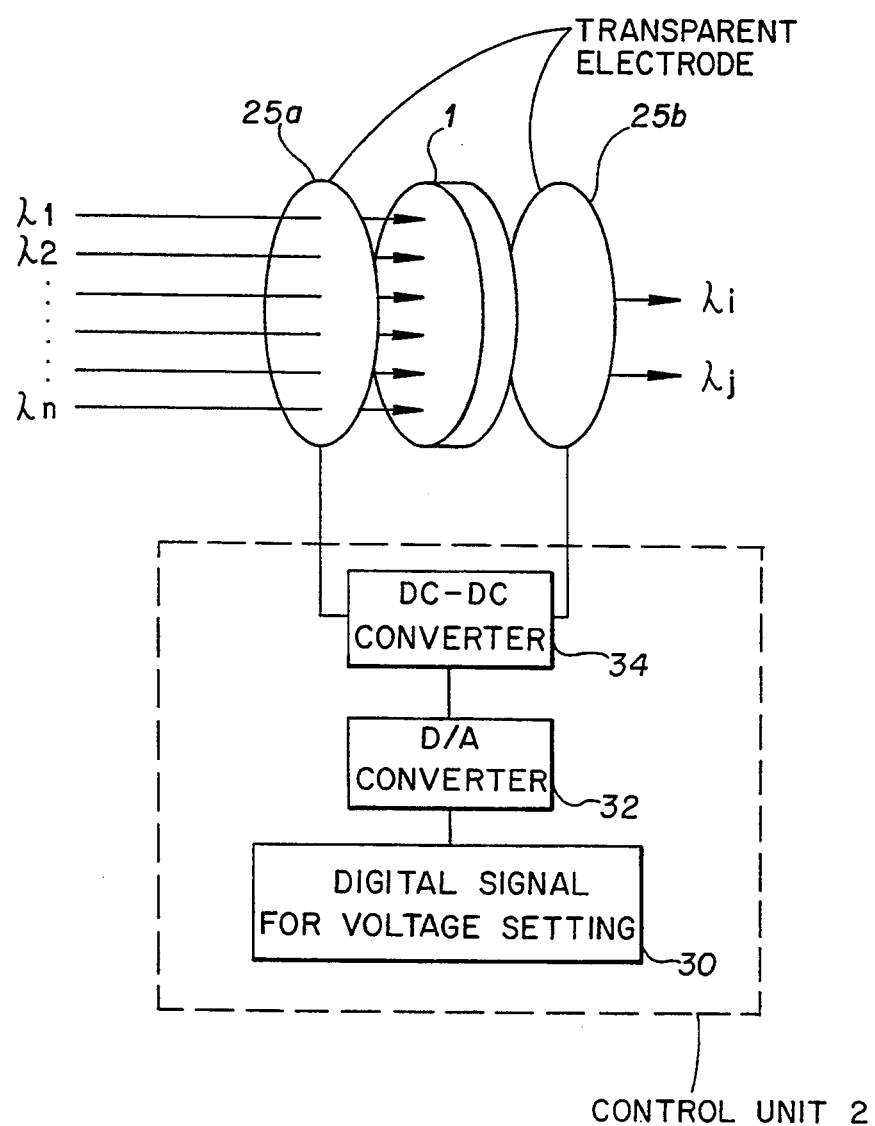
FIG. 11 is a diagram illustrating further details relating to the wavelength selection with an optical computing element according to the invention.

The previously referred to FIG. 2 illustrated a pit 1 controlled by a control unit 2. Reference is now made to the related FIG. 11 which shows further details of the control unit 2 as well as further details associated with the pit 1 for control thereof. FIG. 11 shows, in this regard, the transparent electrodes 25a and 25b in line with and disposed on opposite sides of the pit 1. There is, thus, a pair of electrodes associated with each pit. The electrode is a thin transparent film that is actually formed on both surfaces of the PHB element, as will be described in further detail herein in FIG. 12. Because the PHB element is electrically insulative, different pairs are only required to be disposed with proper distance from pair to pair. Respective voltage is applied to each pair of electrodes.

FIG. 11 illustrates an arrangement for a single pit 1. The signal for voltage setting is established from the control unit 2. In this regard, note the digital signal for voltage setting at 30. This signal is coupled to a D to A converter 32 which in turn controls the converter 34. The converter applies a voltage to the electrodes 25a and 25b to establish a predetermined electric field therebetween, which electric field is a function of the particular voltage set at 30. Thus, the signal for voltage setting is converted to an analog signal by converter 32, and the voltage of the analog signal is changed to a necessary level for electrode control by the converter 34.

For a plural number of pits, a plural number of illustrated units are used independently, or PHB medium 3 (See FIG. 5) is shared by a plural number of sets of electrodes which are disposed each separately.

Figure 12:
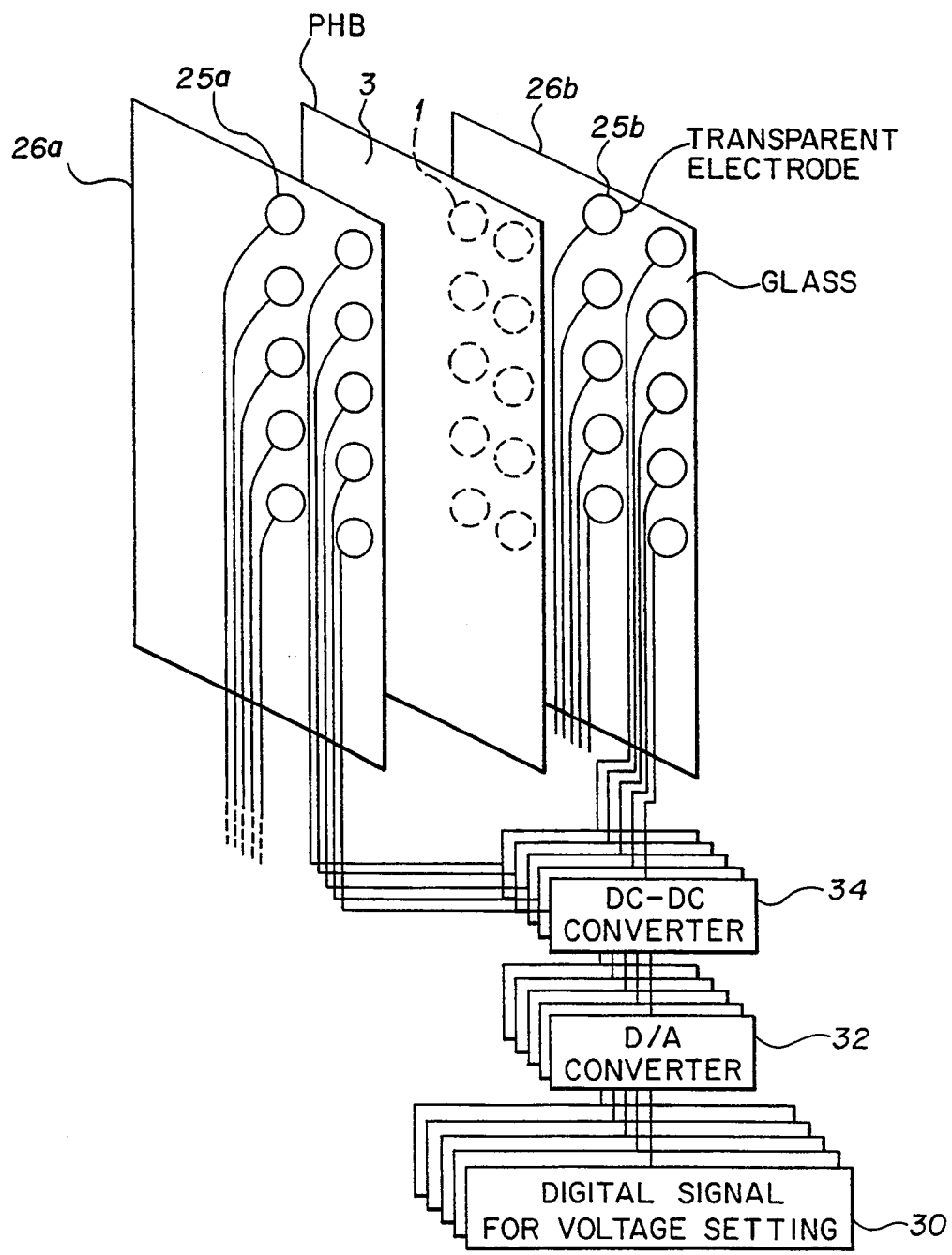
FIG. 12 illustrates more of a system arrangement in which multiple pits are each selectively controllable from the control unit.

The separate spacing is also illustrated in FIG. 12 herein.

FIG. 12 shows an example of a multiple pit HPU. The center plate is the PHB medium 3 and the side plates are the electrode plates 26a and 26b. Each of the electrode plates may be constructed of glass, and the associated transparent electrodes, in other words, plural electrodes 25a and separate plural electrodes 25b, are formed on the surface that faces the PHB plate.

In FIG. 12, the plates are shown exploded away from each other but in actual practice these plates are disposed in contact. In FIG. 12, the dotted circle areas of the PHB plate represent the pits 1.

The electrodes 25a and 25b are formed in a matrix pattern, and the voltage application for each electrode is carried on independently or alternatively sequentially. In this regard, it is noted that for this separate independent control there are separate pairs of lines from the plural converters 34 for providing selective and independent control of each of the pair of electrodes associated with a particular pit.

Signals for voltage setting may be provided from a computer for controlling the filtering characteristics. The computer would control the voltage setting at each of the boxes 30. The number of the control signals corresponds to that of the pits and the signals are independent from each other so that each pit can be controlled independently. It would also be possible to intercouple some of the pairs so that control could be gained. However, in FIG. 12, total independent control is illustrated.

Figure 13:
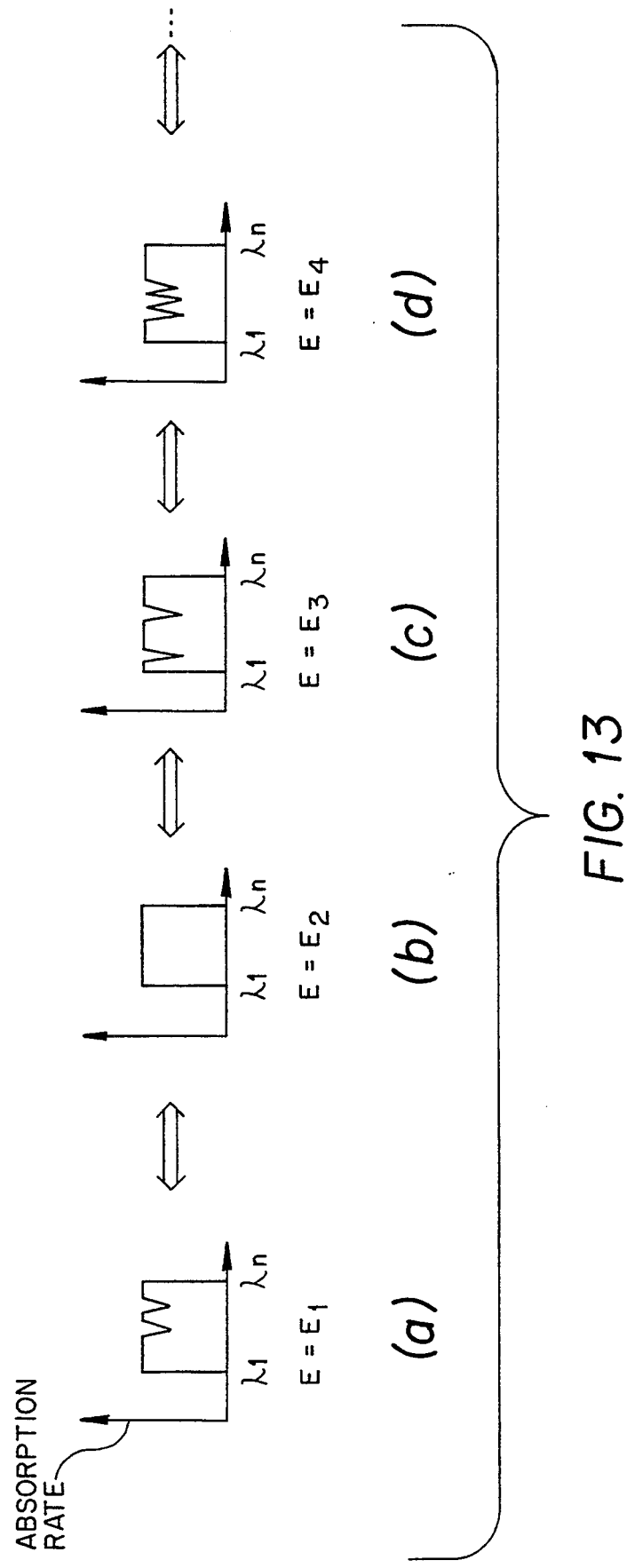
FIG. 13 illustrates different optical absorption rate signals depending upon the electric field applied.

FIG. 13 illustrates various diagrams of absorption rate when different applied voltages E are applied to a pit. FIG. 13 illustrates that as different voltages are applied, the filtering characteristics (optical absorption rate) of the pit change. The optical absorption rate is the reverse of the intensity of the filter passed light. It can be seen that in FIGS. 13(a), (c) and (d) different wavelengths are being passed.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. An optical filtering element for an optical computer, the optical computer including means for processing light rays which include a plurality of wavelength components for carrying out computing functions, comprising:

a photo-chemical hole burning means for selectively transmitting at least one wavelength component in the light rays through the photo-chemical hole burning means, the at least one wavelength component containing a subset of the plurality of wavelength components in the light rays; and means for changing a light transmission characteristic of the photo-chemical hole burning means to select the at least one wavelength component to be transmitted through the photo-chemical hole burning means.

2. An optical filtering element as set forth in claim 1, wherein the optical computer includes an optical input for receiving input light and wherein the optical filtering element comprises means for selecting input light to be processed by the optical computer.

3. An optical filtering element as set forth in claim 1, wherein the optical computer includes an optical output for transmitting output light and wherein the optical filtering element comprises means for selecting output light that has been processed by the optical computer.

4. An optical filtering element as set forth in claim 1, wherein the optical filtering element comprises means for performing gate array functions.

5. An optical filtering element as set forth in claim 1, wherein the optical filtering element comprises means for performing nonlinear threshold functions.

6. An optical filtering element as set forth in claim 1, wherein the optical filtering element comprises means for performing optical memory functions.

7. An optical filtering element as set forth in claim 1, wherein the optical filtering element comprises means for performing optical interconnection functions.

* * * * *